United States Patent
Hitchcock

(10) Patent No.: US 6,677,673 B1
(45) Date of Patent: Jan. 13, 2004

(54) CLAMPING ASSEMBLY FOR HIGH-VOLTAGE SOLID STATE DEVICES

(75) Inventor: Roger N. Hitchcock, San Leandro, CA (US)

(73) Assignee: Varian Medical Systems, Inc., Palo Alto, CA (US)

( * ) Notice: Subject to any disclaimer, the term of this patent is extended or adjusted under 35 U.S.C. 154(b) by 0 days.

(21) Appl. No.: 09/698,334

(22) Filed: Oct. 27, 2000

(51) Int. Cl.$^7$ .............. H01L 1/12; H01L 1/14; H01L 23/02; H05K 7/02
(52) U.S. Cl. ............ 257/718; 257/797; 257/712; 257/685; 257/719; 257/727; 361/802; 361/801; 361/728; 361/729; 361/730; 361/732
(58) Field of Search .................. 257/666, 726, 257/727, 723, 718, 719, 720, 730, 773, 785, 797; 361/809, 801, 728, 729, 730, 732

(56) References Cited

U.S. PATENT DOCUMENTS

| | | | |
|---|---|---|---|
| 3,573,569 A | * | 4/1971 | Davis |
| 3,573,574 A | * | 4/1971 | Davis |
| 3,715,632 A | * | 2/1973 | Warburton .............. 616/326 |
| 6,160,326 A | * | 12/2000 | Iverson et al. ........... 257/723 |
| 6,324,073 B1 | * | 11/2001 | Mikosz et al. ........... 257/686 |
| 2002/0017717 A1 | * | 2/2002 | Gruning ................ 257/718 |

FOREIGN PATENT DOCUMENTS

JP  8-37198  * 2/1996

* cited by examiner

Primary Examiner—Alexander O. Williams
(74) Attorney, Agent, or Firm—Workman Nydegger

(57) ABSTRACT

A clamping assembly for use in conjunction with high voltage solid state devices. The clamping assembly includes a clamp frame having upper and lower clamping plates substantially composed of aluminum and joined together by four dielectric rods composed of glass laminate material. The clamping assembly further includes a compression assembly mounted in the upper clamping plate and including several spring washers disposed in a recess defined by the upper clamping plate. The position of a compression cap attached to the upper clamping plate by eight cap screws can by adjusted by way of the cap screws so as to compress, or deflect, the spring washers. The spring washers in turn exert a compressive force that is a function of the spring constant k of the spring washers as well as of the distance over which the spring washers are compressed by the compression cap. The compressive force thus generated is transmitted to a pivot ball seated in a recess collectively defined by the spring washers. A force distribution member defines a socket in which the pivot ball is partially received and transmits the compressive force to a stack which is disposed between the upper and lower clamping plates and includes semiconductor devices and heat sinks. The socket in the force distribution member permits the force distribution member to rotate with respect to the pivot ball so that the compression surface of the force distribution member automatically moves to a position wherein the compression surface is in substantial contact with the upper surface of the stack, notwithstanding any horizontal misalignment of the stack. As a result of the substantial contact between the compression surface and the upper surface of the stack, the compressive force is distributed substantially uniformly across the upper surface of the stack.

25 Claims, 4 Drawing Sheets

CLAMPING ASSEMBLY FOR HIGH-VOLTAGE SOLID STATE DEVICES

BACKGROUND OF THE INVENTION

1. The Field of the Invention

The present invention relates generally to systems and devices for use in securing semiconductor elements of solid state devices. More particularly, embodiments of the present invention relate to a mechanical clamping assembly which facilitates uniform application of clamping forces to the semiconductor elements of high voltage solid state devices so as to ensure substantial thermal and electrical communication between the semiconductor elements, and thereby contribute to safe, reliable, and effective operation of the solid state device.

2. The Relevant Technology

Semiconductor materials, and devices that employ them, have been in use for some time. The physical and chemical structure of semiconductors makes them especially well suited for use in a variety of applications. In particular, it is well known that some materials such as silicon and germanium are arranged into regular atomic patterns or structures, often referred to as crystals. One characteristic of such materials however is that they are not particularly effective in conducting electricity, nor are they well suited for use as electrical insulators. Because such materials are not particularly useful for electrical conduction, or for impeding electrical conduction, they are generally referred to as "semiconductors."

It is well known however, that by adding various amounts of certain other atoms to the crystal structure of materials such as silicon and germanium, in a process sometimes referred to as "doping," these materials can made to assume certain desirable characteristics. In particular, the doping of materials such as silicon and germanium allows manufacturers to produce materials that have particular desired electrical properties. For example, some semiconductor materials can be doped so that they possess substantially improved electrical conductivity in some situations. Conversely, other semiconductor materials can be doped in such a way that they are substantially resistant to conduction of electricity in certain situations. Notwithstanding the desirable electrical characteristics of doped materials however, both doped and undoped materials are referred to generally as semiconductors.

Thus, semiconductors possess a number of desirable properties. The ability of semiconductors to be modified in a variety of ways to facilitate achievement of particular results or effects makes useful in a variety of applications. Further, because the semiconductors comprise solid crystals, they are resistant to rough handling and vibration.

Because the semiconductor material takes a solid form or "state," electronic parts, components, and devices employing semiconductor materials are often referred to as "solid state" devices. Solid state devices are embodied in a virtually endless variety of forms. Examples of common solid state devices include relays, thyristor switch assemblies, transistors, and diodes. Furthermore, there are numerous fields of application for solid state devices. For example, solid state devices are commonly employed in lasers, radar systems, x-ray tubes, and the like.

Solid state devices are constructed in any of a variety of different ways. One common construction method involves stacking a plurality of semiconductor elements. For example, in the case of high voltage solid state devices, a sufficient number of semiconductor devices must be connected together in series to obtain the required voltage rating. Thus, to operate such a solid state device at 10,000 volts, three semiconductor devices rated at 4,500 volts each would be connected in series to obtain an aggregate rating for the solid state device of 13,500 volts.

Typically, the stack of semiconductor devices, or "stack" elements, are subjected to large compressive forces, sometimes as high as 10,000 pounds, in order to enhance their operational characteristics. Application and maintenance of the compressive force are important to the overall operation of the solid state device in that the compression facilitates substantial contact between the individual stack elements. This substantial contact, in turn, facilitates a high degree of thermal and electrical communication between the various stack elements. Because some of the stack elements typically comprise heat sinks or the like, a high level of thermal communication between the stack elements facilitates effective removal of heat from the solid state device. In similar fashion, good electrical communication between the stack elements facilitates safe, reliable, and effective operation of the solid state device.

In order to supply the large compressive forces necessary to facilitate effective and reliable operation of the solid state device, a variety of clamps and clamping devices have been devised. As discussed below, however, many known clamping devices suffer from a variety of shortcomings that render them ineffectual and/or cause damage to the stack elements. Such shortcomings are further aggravated when attempts are made to use known devices in high voltage environments.

Some of the problems and shortcomings with known clamping devices relate to the materials used to construct those devices. In general, known clamping devices typically employ upper and lower clamping plates joined together by a number of compression bolts. Typically, the stack is disposed between the upper and lower compression plates and nuts on the compression bolts are then tightened as required to move the upper and lower clamping plates together, and thereby compress the stack elements together.

In high voltage applications, in particular, the voltages involved are so large that the spacing between the stack and the compression bolts is insufficient to prevent arcing between the stack elements and the compression bolts. Accordingly, many known clamping devices that have been developed for use in high voltage environments employ compression bolts comprising fiberglass or other electrically non-conductive material. While the fiberglass material represents an improvement in that it substantially prevents arcing between the stack elements and the compression bolts, it has certain inherent shortcomings.

A significant problem with the fiberglass compression bolts relates to the relative softness of the fiberglass material. Specifically, clamping forces as high as ten thousand pounds are required in some high voltage applications to establish and maintain the contact between the stack elements that is necessary for effective and reliable operation of the solid state device. Thus, the nuts must be tightened to a high degree to produce such clamping forces. As a result of the high clamping forces that they are required to impose, the relatively soft threads of the fiberglass compression bolts are vulnerable to stripping.

A related problem with compression bolts constructed of fiberglass and like materials concerns the difficulty of tightening the nuts on the compression bolts in a symmetric fashion. That is, the nuts must be tightened so that the compression force exerted by the clamping device is distributed evenly across the upper surface of the stack. This arrangement is necessary to ensure consistent and substantial contact between the stack elements and thus, effective and efficient operation of the solid state device. As discussed below, this result is difficult to achieve in practice, and it is generally the case that the nuts on the compression bolts are tightened at least somewhat asymmetrically.

A typical consequence of even slightly asymmetric or unbalanced tightening of the nuts on the compression bolts is that the magnitude of the mechanical stresses and strains between the nut and corresponding compression bolt in the region of relatively greater stack compression is materially higher than the magnitude of the mechanical stresses and strains between the nut and corresponding compression bolt in the region of relatively lesser stack compression. The high stresses and strains that typically result from asymmetric tightening of the nuts on the compression bolts can cause stripping of the compression bolt threads, thereby requiring removal and replacement of the compression bolt.

In addition to the problems inherent in the use of compression bolts made of fiberglass or similar materials, known clamps and clamping devices suffer from other shortcomings as well. One such problem relates to the magnitude of the clamping forces employed in compressing a particular stack of elements. As previously discussed, many known clamping devices employ a plurality of compression bolts or the like which are used to provide the compression required for reliable and effective operation of the solid state device. However, it is difficult, if not impossible, for the assembler of the solid state device to determine with any degree of certainty the magnitude of the clamping force being applied as the nuts on the compression bolts are tightened. Thus, an assembler may inadvertently overtighten or undertighten the nuts on the compression bolts. As discussed below in detail below, undesirable consequences are implicated in either case.

Specifically, where the nuts on compression bolts are overtightened, the resulting compressive force exerted on adjacent regions of the stack may become sufficiently large in magnitude as to cause damage to the stack elements. In many cases, this damage will be imperceptible and may not be fully appreciated until attempts are made to energize and use the solid state device. Alternatively, in the case of undertightening, if the compressive force exerted by the clamping assembly on the stack is of insufficient magnitude, the contact between the stack elements that is required for efficient operation of the solid state device will not be achieved. Thus, it is important that the assembler be able to readily ascertain the magnitude of the clamping force being exerted upon the stack by the clamp or clamping device.

Not only is it difficult, in the context of known clamps and clamping assemblies, to ascertain the magnitude of the compressive force being applied to the stack, but known clamps and clamping assembly typically make no provision for a reliable guide that would insure that the compressive force applied is uniformly distributed across the upper surface of the stack. Rather, the assembler is typically compelled to tighten the nuts on the compression bolts in some type of cross-tightening manner in an attempt to insure uniform application of the compressive force to the stack. Such methods are unreliable, however, and typically result in an imbalance in the compressive force applied to the stack.

In particular, the nuts on some of the compression bolts are secured more tightly than others. As a result, the compressive force applied by the clamping device is not uniformly applied across the top of the stack, and the compressive force is relatively greater in some regions of the stack than in others. Such imbalances in the magnitude of the compressive force applied to the stack can cause crushing or other damage to stack elements in the region of the relatively higher compressive force and, at the same time, may result in insufficient contact between the stack elements in the region of the relatively lower compressive force.

Finally, known clamping devices and systems are generally ill-equipped to compensate for the horizontal misalignment of stack elements that commonly occurs. In particular, due to causes such as variations in the manufacturing processes used to produce the stack elements, it is often the case that stack elements are of varying thickness. That is, some regions of a particular stack element may be thicker than other regions of the same stack element.

Accordingly, when a plurality of stack elements are employed to construct a stack of a solid state device, it often occurs that the upper surface of the stack is not horizontal, or is horizontally misaligned. In particular, one side of the stack is relatively higher than the other side of the stack. Thus, even if the compression bolts are tightened uniformly, a force imbalance on the stack occurs because one side of the stack is higher than the other side of the stack. In particular, the compressive force on the relatively higher side of the stack is of relatively larger magnitude than the compressive force on the relatively lower side of the stack. As discussed elsewhere herein, such force imbalances materially compromise the operation and reliability of the solid state device.

Even in instances where horizontal misalignment of the stack elements could be readily perceived, known clamping devices provide no effective way to compensate for, or remedy, the misalignment. While attempts could be made to overtighten the nuts of some compression bolts and undertighten others, so as to achieve application of a compressive force somewhat more evenly distributed across the top of the misaligned stack, such relative overtightening and undertightening implicates, as described earlier, a variety of undesirable effects with regard to the compression bolts, and the overall integrity and operation of the solid state device.

In view of the foregoing problems and shortcomings with existing clamping devices and assemblies, it would be an advancement in the art to provide a clamping assembly that applies the compressive force evenly across the top of the stack. Additionally, the clamping assembly should facilitate ready ascertainment of the magnitude of the compressive force being applied to the stack. Finally, the clamping assembly should be suitable for use in high voltage environments.

SUMMARY AND OBJECTS OF THE INVENTION

The present invention has been developed in response to the current state of the art, and in particular in response to these and other problems and needs that have not been fully or adequately solved by currently available clamping assemblies. Thus, it is an overall object of embodiments of the present invention to provide a clamping assembly that facilitates relatively uniform distribution of the clamping force across the top of the stack notwithstanding any misalignment of the stack, and that facilitates ready ascertainment of the magnitude of the compressive force being applied. Embodiments of the present invention are especially well suited for use in the context of high voltage solid state devices. However, it will be appreciated that various features and advantages of the present invention may find useful application in other environments as well.

In a preferred embodiment, the clamping assembly includes a clamp frame having upper and lower clamping plates, preferably comprising aluminum or the like, connected by four dielectric rods. The dielectric rods preferably comprise G-10 or FR-4 laminate and are removably pinned at each end to the respective clamping plates so that the clamping plates are separated by a space. The elements of the stack include a plurality of semiconductors, preferably disk type, such as high current thyristors or the like. Heat sinks, preferably comprised substantially of copper and configured for fluid communication with a source of coolant, are interposed between the disk type semiconductors so as to remove heat therefrom.

The stack of semiconductors and heat sinks is disposed between the space defined by the upper and lower clamping plates and is secured so as to prevent lateral motion of the stack elements with respect to each other, and with respect to the clamp frame. Securement of the stack elements in this manner is preferably accomplished by way of a plurality of metal alignment pins removably received in cavities defined in the stack elements and one or both of the clamping plates.

A plurality of spring washers are disposed in a recess defined in the upper clamping plate. A compression cap on top of the upper clamping plate, and secured to the upper clamping plate by a plurality of cap screws, facilitates adjustments to the compressive force exerted by the spring washers. Specifically, adjustments to the cap screws provide relative changes in the deflection imposed upon the spring washers by the compression cap. Such changes in deflection of the spring washers translate to changes in the magnitude of the compressive force exerted by the spring washers and transmitted to the stack.

The clamping assembly further includes a force distribution member, preferably comprising a substantially cone shaped geometry having a substantially circular, flat surface at one end aligned with and in substantial contact with the top of the stack. At the vertex of the cone, a socket is defined in which a pivot ball, preferably comprised of chrome steel, is received, so as to facilitate relative motion between the pivot ball and the force distribution member. A portion of the pivot ball not disposed in the socket is seated within a recess collectively defined by the spring washers. A hole defined in the compression cap communicates with that recess so as to enable ready measurement of the distance from the top portion of the pivot ball received in the recess to the top of the compression cap.

In operation, the cap screws are tightened to the extent necessary to achieve a desired compressive force on the stack. In particular, tightening of the cap screws causes the compression cap to advance so as to exert a force of predetermined magnitude on the ring washers. In response to imposition of that force by the compression cap, the spring washers transmit a proportional compressive force to the pivot ball seated in the recess defined by the spring washers. Because a portion of the pivot ball is received in the socket defined by the force distribution member, the pivot ball acts to transfers the compression force to the force distribution member which, by virtue of its flat circular surface, distributes the compression force substantially uniformly across the top of the stack.

Various features of embodiments of the present invention facilitate ready determination of the magnitude of the compressive force imposed by the clamping assembly on the stack. In particular, the magnitude of that compressive force is a function of the spring constant "k" of the spring washers and the distance "x" that the spring washers are compressed. Because k is known, or can be readily determined, for particular spring washers and because the distance that the spring washers are compressed can be measured by way of the hole defined in the compression cap, the magnitude of the compressive force exerted by the spring washers can be readily determined. In a preferred embodiment, a mechanical indicator or the like automatically displays the distance from the top of the pivot ball to the top of the compression cap, so that no measurement step is required.

Because the spring washers transmit the compressive force indirectly, rather than directly, to the stack by way of the pivot ball and the force distribution member, asymmetric tightening of the compression bolts, should it occur, will not cause any harm to the stack. Furthermore, because the force distribution member is arranged for rotational movement with respect to the pivot ball, any horizontal misalignment of the stack is readily accommodated by movement of the force distribution member. In this way, the force distribution member remains in substantial contact with the upper surface of the stack, notwithstanding any horizontal misalignment of the stack. As a result, the applied compressive force is, in all cases, uniformly distributed across the upper surface of the stack. Finally, because the rods attaching the upper and lower clamping plates are comprised of a dielectric material, embodiments of the present invention are particularly well suited for use in high voltage applications.

These and other objects and features of the present invention will become more fully apparent from the following description and appended claims, or may be learned by the practice of the invention as set forth hereinafter.

BRIEF DESCRIPTION OF THE DRAWINGS

In order that the manner in which the above-recited and other advantages and features of the invention are obtained, a more particular description of the invention briefly described above will be rendered by reference to specific embodiments thereof which are illustrated in the appended drawings. Understanding that these drawings depict only typical embodiments of the invention and are not therefore to be considered limiting of its scope, the invention will be described and explained with additional specificity and detail through the use of the accompanying drawings in which.

DETAILED DESCRIPTION OF VARIOUS EMBODIMENTS OF THE INVENTION

Reference will now be made to figures wherein like structures will be provided with like reference designations. It is to be understood that the drawings are diagrammatic and schematic representations of various embodiments of the claimed invention, and are not to be construed as limiting the present claimed invention, nor are the drawings necessarily drawn to scale.

Figure 1:
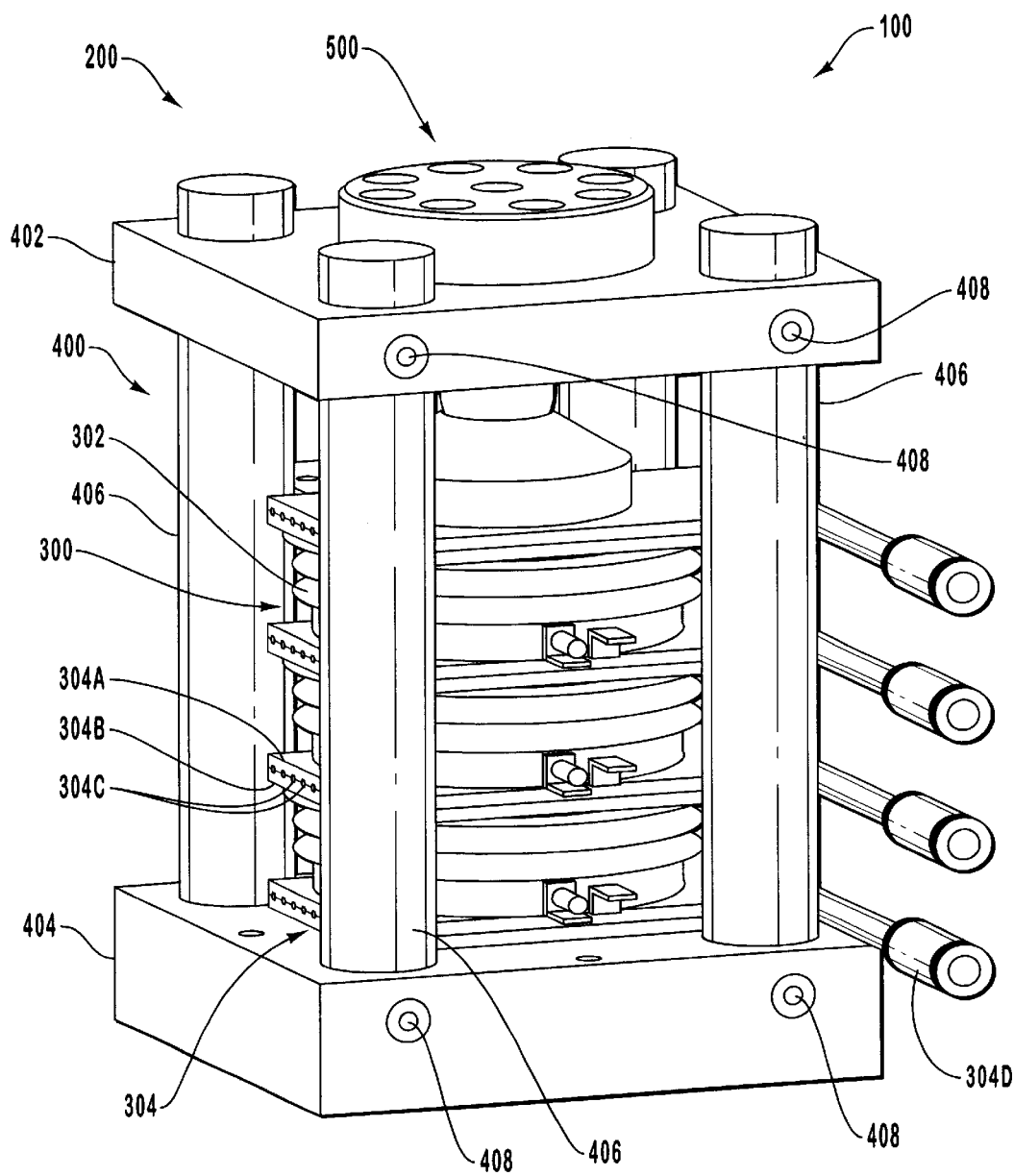
FIG. 1 is a perspective view that illustrates various details of an embodiment of a solid state assembly.

Reference is first made to FIG. 1, wherein a solid state assembly is indicated generally at 100. Solid state assembly 100 includes a clamping assembly 200 and a stack 300. In general, stack 300 is secured in clamping assembly 200 so that clamping, or compressive, forces exerted by clamping assembly 200 can be transmitted to stack 300.

Clamping assembly 200 includes clamp frame 400 and compression assembly 500 mounted in clamp frame 400 and positioned so as to facilitate imposition of compressive forces on stack 300. Clamp frame 400 includes upper clamping plate 402 and lower clamping plate 404 joined by a plurality of connecting rods 406. Preferably, lower clamping plate 404 is relatively thicker than upper clamping plate 402 so that lower clamping plate 404 is not deflected by the compressive forces exerted by compression assembly 500. In a preferred embodiment, both upper and lower clamping plates 402 and 404 comprise 6061-T651 aluminum or the like. It should be noted that, in general, 6061-T651 aluminum refers to extruded bars having the following chemical composition: about 0.4 to about 0.8 percent silicon; about 0.7 percent iron; about 0.15 to about 0.40 percent copper; about 0.15 percent manganese; about 0.8 to about 1.2 percent magnesium; about 0.04 to about 0.35 percent chromium; about 0.25 percent zinc; and about 0.15 percent titanium, with the remainder comprising aluminum.

Connecting rods 406 comprise substantially dielectric materials, preferably G-10 or FR-4 glass laminate, suitable for use in high voltage environments. It will be appreciated that variables such as, but not limited to, the size, diameter, length, and number of connecting rods 406 may be varied as required to suit a particular application and/or to facilitate achievement of one or more desired results. In connection with the aforementioned reference to G-10 and FR-4 laminates, such materials generally comprise a continuous filament woven glass fabric laminated with an epoxy resin binder. Typically, the epoxy resin is made from an epichlorohydrin/bisphenol, and generally contains no other halogenated components. The structural properties of such laminates will vary depending upon the particular structural implementation.

Generally, G-10/FR-4, comprises one example of a 'glass epoxy laminate,' as such term is used herein. When formed into shapes such as those exemplified by connecting rods 406, G-10/FR-4 will typically exhibit the following properties: specific gravity of about 1.85; tensile strength of about 38,000 pounds per square inch ("psi"); compressive strength of about 66,000 psi; flexural strength of about 60,000 psi; an M scale hardness of about 115; a bond strength of about 2300 pounds; a shear strength of about 21,500 pounds; a dissipation factor ($10^6$ cycles, Cond, A) of about 0.032; a dielectric strength ($10^6$ cycles, Cond, A) of about 4.8; an electric strength (V/Mil Cond. A) of about 800; a flammability rating of 94V-0; a maximum operating temperature of about 140° C.; a coefficient of thermal expansion (In/In° × $10^{-5}$) of about 1.0; and a water absorption (% in 24 hours) of about 0.10.

As discussed in greater detail below, connecting rods 406 are joined, preferably removably, to upper clamping plate 402 and lower clamping plate 404 by way of pull out dowel pins 408. Pull out dowel pins 408 preferably comprise alloy steel or the like and serve to facilitate, among other things, ready disassembly and reassembly of clamp frame 400. It will be appreciated that various other structures and devices would be equally effective in removably joining connecting rods 406 to upper and lower clamping plates 402 and 404, respectively.

Figure 2:
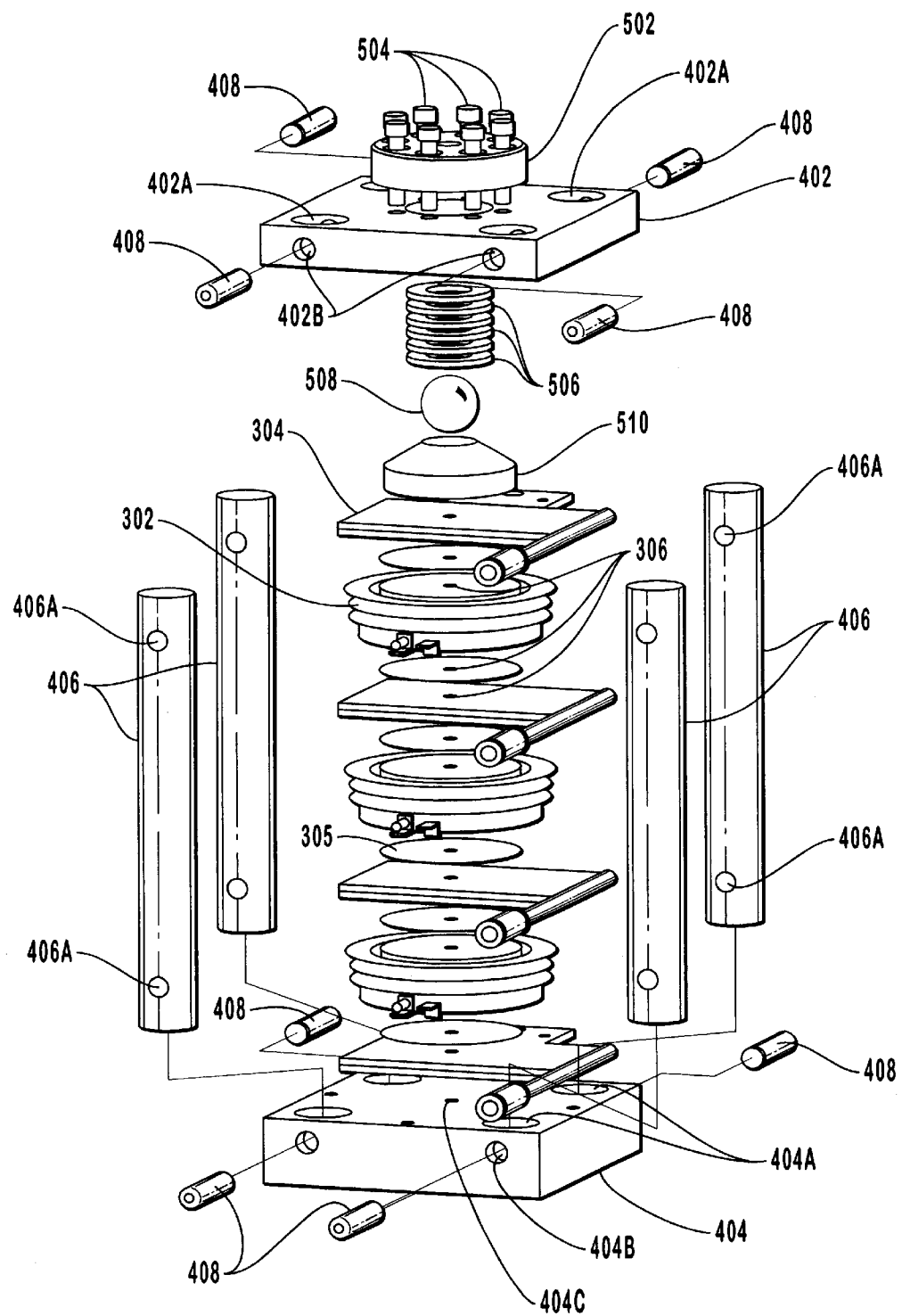
FIG. 2 is an exploded view indicating relationships between various elements of an embodiment of a solid state assembly.

Directing continued attention to FIG. 1, stack 300 includes a plurality of semiconductors 302, heat sinks 304, and thermal films 305 (see FIG. 2). It will be appreciated that semiconductors 302, heat sinks 304, and thermal films 305 are exemplary stack elements and that various other types of stack elements may be employed as well, wherein such other types of stack elements include, but are not limited to, heat sink materials, isolators, connection plates, and the like. In general, embodiments of the present invention are suitable for applications where it is desired to apply compressive forces to the stack of a solid state device or solid state assembly. Accordingly, the scope of the present invention should not be construed to be limited to the exemplary stack elements, or combinations thereof, recited herein.

Preferably, semiconductor 302 comprises a device such as a high current thyristor or the like. It will be appreciated however, that semiconductor 302 may comprise or incorporate a variety of other devices, components, or combinations thereof, including, but not limited to, diodes, relays, and transistors. It will likewise be appreciated that stack 300 may employ a variety of different types and combinations of semiconductors 302 as required to suit a particular application and/or to facilitate achievement of one or more desired results or effects.

It will be appreciated that various features of the construction and composition of semiconductors 302 may be varied or modified as required to suit a particular application. Thus, while a preferred embodiment of semiconductor 302 is substantially round in shape, semiconductors 302 of various other shapes may be employed as well. With regard to their composition, semiconductors 302 are substantially composed of carbon (C), silicon (Si), germanium (Ge), or tin (Sn) doped with one or more elements selected from the group consisting of boron (B), aluminum (Al), gallium (Ga), indium (In), nitrogen (N), phosphorous (P), arsenic (As) and antimony (Sb).

In addition to semiconductors 302 and thermal films 305, stack 300 also preferably includes a plurality of heat sinks 304. As indicated in FIG. 1, heat sinks 304 are interposed between semiconductor elements 302 so as to facilitate removal of heat therefrom. Thermal films 305 (see FIG. 2) facilitate a high level of heat transfer between semiconductor elements 302 and heat sinks 304. In a preferred embodiment, each heat sink 304 is substantially composed of a heat conducting material, such as copper or a copper alloy, and includes an upper surface 304A and lower surface 304B which cooperate to define a plurality of coolant passageways 304C in fluid communication with a coolant inlet/outlet connection 304D. An external cooling unit or the like (not shown) in fluid communication with coolant inlet/outlet connection 304C serves to circulate a coolant, such as a dielectric fluid or the like, through heat sinks 304. The circulating coolant removes at least some heat from semiconductors 302, by way of heat sinks 304, and then returns to the external cooling unit. The external cooling unit removes at least some heat from the coolant and then returns the coolant to heat sinks 304 to repeat the cycle. It will be appreciated that various other coolants, such as air, that are suitable for use in high voltage environments may profitably be employed in conjunction with embodiments of the present invention.

Directing attention now to FIG. 2, and with continuing attention to FIG. 1, various aspects and features of clamp frame 400 are discussed in further detail. As previously noted, upper clamping plate 402 and lower clamping plate 404 are joined together by way of connecting rods 406 removably connected to upper clamping plate 402 and lower clamping plate 404. In particular, connecting rods 406 are removably received in mating recesses 402A and 404A defined by upper clamping plate 402 and lower clamping plate 404, respectively. Dowel pin holes 406A defined in connecting rods 406 align with corresponding dowel pin holes 402B and 404B defined in upper clamping plate 402 and lower clamping plate 404, respectively, when connecting rods 406 are fully received in corresponding mating recesses 402A and 404A. Pull out dowel pins 408 thus facilitate ready and secure assembly of clamp frame 400. Because pull out dowel pins 408 can be easily removed, they also serve to facilitate disassembly of clamp frame 400.

Figure 3:
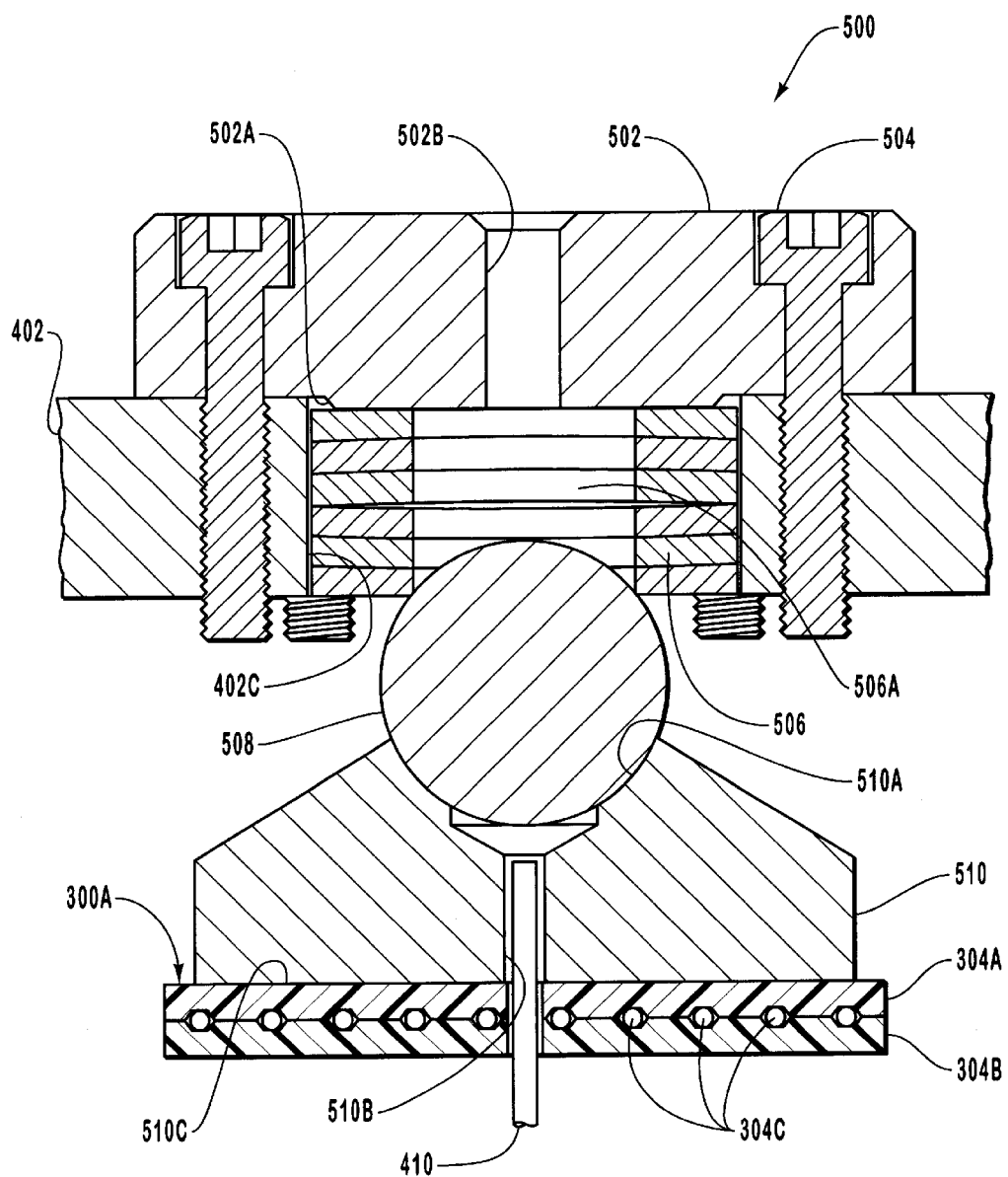
FIG. 3 is a cross-section view indicating various details of an embodiment of a clamping assembly.

Clamp frame 400 and stack 300 additionally include complementary features which facilitate alignment of stack 300 with respect to clamp frame 400. In particular, each stack element of stack 300 includes at least one alignment hole, depicted generally at 306, through which an alignment pin 410 or similar device (see FIG. 3) is inserted. Note that while only a single alignment pin 410 is indicated in FIG. 3, one embodiment of the present invention includes four (4) alignment pins 410 and, accordingly, four alignment holes 306. It will be appreciated however, that various numbers of alignment pins 410 (and corresponding alignment holes 306) may be used as required to suit a particular application and/or to achieve one or more desired results.

Alignment pin 410 extends through holes 306 of stack 300 so that one end is received in alignment pin recess 404C defined in lower clamping plate 404, and the other end of alignment pin 410 protrudes from stack 300 and is received in force distribution member 510 (discussed in detail below) of clamping assembly 200. Thus situated, alignment pin 410 cooperates with clamp frame 400 to ensure that the elements of stack 300 are substantially precluded from horizontal movement with respect to each other and with respect to clamp frame 400. It will be appreciated that a variety of other structures and devices may be employed to provide the aforementioned alignment function.

Directing attention now to FIG. 3, and with continuing attention to FIG. 2, various features of compression assembly 500 are discussed in further detail. In particular, compression assembly 500 includes a compression cap 502 secured to upper clamping plate 402 by a plurality of adjusting elements 504 preferably comprising alloy steel or the like. In a preferred embodiment, adjusting elements 504 comprise cap screws, or the like, threaded for engagement with upper clamping plate 402. However, it will be appreciated that any other structure or device providing the functionality of adjusting elements 504, as disclosed herein, is contemplated as being within the scope of the present invention. It will further be appreciated that variables including, but not limited to, the size, shape and number of adjusting elements 504 may be varied as required to suit a particular application and/or to facilitate achievement of one or more desired results.

Compression cap 502 includes a compressing surface 502A, preferably integral with compression cap 502, substantially aligned with a recess 402C defined in upper clamping plate 402 so that a downward motion (with reference to FIG. 3) of compression cap 502 causes compressing surface 502A to at least partially enter recess 402C and compress resilient elements 506 disposed therein. It will be appreciated that the thickness or other geometric features of compressing surface 502A may be varied as required to suit a particular application and/or to facilitate achievement of one or more desired effects with respect to resilient elements 506.

In a preferred embodiment, resilient elements 506 comprise spring washers or the like substantially composed of carbon steel and shaped and arranged so as to collectively define a recess 506A (discussed in detail below). It will be appreciated however, that various other types of resilient structures and devices may be employed to provide the functionality of resilient elements 506 wherein such other types of resilient structures and devices include, but are not limited to, helical springs and the like. It will further be appreciated that variables including, but not limited to, the thickness, spring constant "k", material, and number of resilient elements 506 may be varied individually and/or in various combinations as required to suit a particular application and/or to facilitate achievement of one or more desired results. For example, the number of resilient elements 506 may be adjusted so as to achieve a desired aggregate spring constant k consistent with a particular application.

Finally, compression cap 502 defines a measuring hole 502B substantially aligned with recess 402C. As discussed in greater detail below, measuring hole 502B facilitates ready ascertainment of the magnitude of the compressive force being exerted by compression assembly 500 on stack 300.

With continuing attention to FIG. 3, compression assembly 500 additionally includes pivot ball 508, preferably substantially spherical in shape and comprising chrome steel or the like, partially seated in recess 506A collectively defined by resilient elements 506. Force distribution member 510, preferably conical in shape, defines a socket 510A at its vertex wherein pivot ball 508 is rotatably supported. This arrangement facilitates rotational motion of force distribution member 510 relative to pivot ball 508. Alignment hole 510B defined in force distribution member 510 receives alignment pin 410 (previously discussed) extending upward from stack 300 so that significant horizontal motion of said force distribution member 510 is substantially precluded. However, alignment hole 510B is preferably somewhat larger in diameter than alignment pin 410 so as to permit some limited lateral motion of force distribution member 410. Finally, force distribution member 510 includes a substantially flat compression surface 510C in substantial contact with upper surface 300A of stack 300.

In operation, stack 300 is disposed between upper clamping plate 402 and lower clamping plate 404 and vertically aligned as previously discussed. Since upper clamping plate 402 is fixed with respect to stack 300, rotation of adjusting elements 504 causes compression cap 502 to advance downward a desired distance, thereby compressing resilient elements 506 which respond by exerting a characteristic compressive force.

One advantage of compression assembly 500 concerns the employment of alloy steel adjusting elements 504. As previously noted, fiberglass compression bolts such as those typically employed in known clamping devices are prone to stripping and other damage due to the relative softness of the fiberglass. Because adjusting elements 504 comprise a hard material such as alloy steel or the like, they are not as vulnerable to such problems. Further, the dielectric functionality enabled by the fiberglass compression bolts of known clamping devices is provided by connecting rods 406. Thus, embodiments of the present invention serve to substantially preclude the problems associated with fiberglass compression bolts, while maintaining a dielectric functionality that makes them well suited for use in high voltage environments.

With continuing attention now to various operational details of embodiments of the present invention, the compressive force exerted by resilient elements 506 is then transmitted to upper surface 300A of stack 300 by way of pivot ball 508 and force distribution member 510. Force distribution member 510 rotates about pivot ball 508 as/if required to compensate for any horizontal misalignment of stack 300. As discussed in detail below, the compressive force facilitated by rotation of adjusting elements 504 is a function of, among other things, the spring constant k of resilient elements 506, and the extent to which resilient elements 506 are deflected by compression cap 502.

Compression assembly 500 thus facilitates imposition of compressive forces sufficiently high as to ensure substantial contact between the elements of stack 300. This substantial contact in turn facilitates a high level of electrical and thermal communication between and among the elements of stack 300, thereby contributing to safe, reliable, and efficient operation of solid state assembly 100.

Note that as contemplated herein, "horizontal misalignment" refers to stack 300 configurations wherein a plane defined as upper surface 300A, discussed in further detail below, of stack 300 is not parallel to a predefined horizontal plane. Preferably, such predefined horizontal plane comprises a plane defined by upper clamping plate 402. It will be appreciated that horizontal misalignment of stack 300 may arise in a variety of circumstances. For example, as previously discussed, such horizontal misalignment may occur as a result of the manufacturing of semiconductors 302 or other stack elements. Alternatively, even if semiconductors 302 or other stack elements are manufactured so that each is of a relatively uniform thickness that would give rise to a properly aligned stack 300, foreign matter or the like present between lower clamping plate 404 and stack 300 could impose a horizontal misalignment on an otherwise properly aligned stack 300. Finally, manufacturing inconsistencies or other defects in lower clamping plate 404 may likewise impose a horizontal misalignment on an otherwise properly aligned stack 300.

Not only does compression assembly 500 facilitate uniform imposition of compressive forces on stack 300, but embodiments of the present invention facilitate ready ascertainment of the magnitude of the compressive force being applied to stack 300. In particular, it will be appreciated that the magnitude of the compressive force exerted by resilient elements 506 can be determined from the relationship $f=kx$, where $f$ is the compressive force, k is a spring constant unique to resilient element 506 (or collectively defined by resilient elements 506 when a plurality thereof are employed) and x is the distance over which resilient elements 506 are compressed. Because the spring constant k of resilient members 506 is known, and because the distance between the top of compression cap 502 and pivot ball 508 can be readily measured by way of measuring hole 502B, the compressive force exerted by compression assembly 500 on stack 300 can be readily ascertained. In particular, by measuring the distance from the top of compression cap 502 to the top of pivot ball 508, both before and after compression of resilient elements 506, the total distance x over which resilient elements 506 have been compressed can be determined by simply taking the difference between the two distances measured.

Since k is known and x has been determined as described above, $f$ can then be readily determined through application of the aforementioned relationship. As a result, the magnitude of the compressive force being exerted by compression assembly 500 can be readily and accurately ascertained. This feature is advantageous, for example, in situations where, due to environmental conditions such as heat and vibration, the compressive force exerted by compression assembly 500 may vary over time. Furthermore, this feature enables ready achievement and verification of the compressive force required in a particular application.

It will be appreciated that various other methods and/or devices may be employed to determine, either directly or indirectly, the magnitude of the compressive force exerted by compression assembly 500 on stack 300. For example, various types of mechanical indicators may be employed that discern and display the extent to which resilient elements 506 have been compressed. Such a mechanical indicator may either be used alone to facilitate indirect determinations of the magnitude of the compressive force, or in conjunction with microprocessors, displays and the like so as to indicate directly the magnitude of the compressive force being exerted by compression assembly 500.

Figure 4:
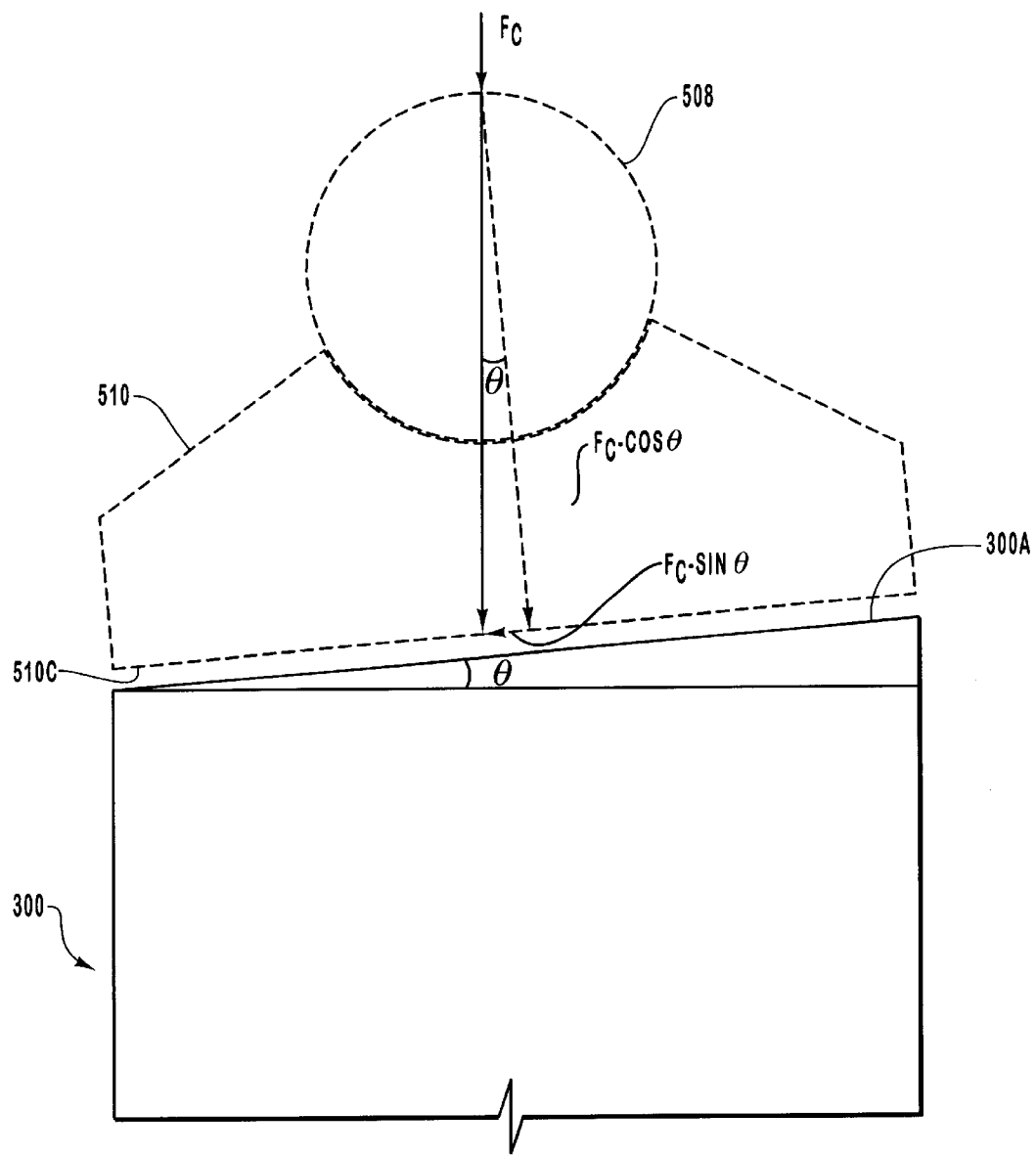
FIG. 4 is a schematic illustrating various operational details of an embodiment of a force distribution member.

Directing attention now to FIG. 4, and with continuing attention to FIG. 3, various additional features regarding the operation of compression assembly 500 are discussed in further detail. As previously discussed, stack 300 may, in some instances, be horizontally misaligned. An example of such an arrangement is indicated in FIG. 4. As suggested there, the respective geometries of force distribution member 510 and pivot ball 508 permit force distribution member 510 to rotate relative to pivot ball 508 so as to compensate for any horizontal misalignment of stack 300 and thereby facilitate substantially even distribution of the compressive force across upper surface 300A of stack 300.

Note that a variety of means may be profitably employed to perform the functions, enumerated herein, cooperatively performed by pivot ball 508 and force distribution member 510. Pivot ball 508 and force distribution member 510 collectively comprise an example of a means for facilitating substantially uniform distribution of a compressive force on stack 300. Accordingly, the structure disclosed herein simply represents one embodiment of structure capable of performing these functions. It should be understood that this structure is presented solely by way of example and should not be construed as limiting the scope of the present invention in any way.

For example then, a compressive force, denoted "$F_c$", exerted on pivot ball 508 and transmitted to force distribution member 510 comprises two components, each of which is related to the misalignment angle, denoted "$\theta$" in FIG. 4, of a particular stack 300. It will be appreciated that various known geometric relationships can be used to demonstrate that the two angles denoted "$\theta$" in FIG. 4 are in fact, equal. In particular, $F_c$ comprises the components $F_c \cos \theta$ and $F_c \sin \theta$. It will be appreciated that because the $F_c \sin \theta$ component acts in a direction that is parallel to upper surface 300A of stack 300, that component plays no material role in the compression of stack 300. On the other hand, the $F_c \cos \theta$ component acts in the "normal" or perpendicular direction with respect to upper surface 300A and thus is effective in compressing stack 300.

As is well known, the point force represented by $F_c \cos \theta$ can be considered to be uniformly distributed across compression surface 510C of force distribution member 510 so that, notwithstanding misalignment of stack 300, no imbalance of the compressive force ultimately applied to upper surface 300A of stack 300 occurs. Consequently, damage to stack 300 resulting from an unbalanced application of the compressive force to upper surface 300A is substantially foreclosed.

Compression assembly 500 has other advantageous features as well. For example, the assembler of solid state assembly 100 need not take remedial action for, or even be aware of, horizontal misalignment of stack 300. Rather, because force distribution member 510 is free at all times to rotate with respect to pivot ball 508, force distribution member 510 will respond automatically in response to any horizontal misalignment of stack 300 by rotating to a position wherein substantially uniform contact between compression surface 510C and upper surface 300A of stack 300 is achieved.

Finally, even if adjusting elements 504 are asymmetrically tightened, no compressive force imbalance on stack 300 occurs. In particular, while an unbalanced force applied to resilient elements 506 may have an undesirable impact with respect to the magnitude of the compressive force produced by resilient elements 506 in response, pivot ball 508 and force distribution member 510 cooperate to ensure that whatever compressive force is ultimately generated by resilient elements 506 is distributed substantially uniformly across upper surface 300A of stack 300. Thus, compression assembly 500 is able to automatically compensate for asymmetrically tightened adjusting elements 504 and thereby foreclose damage to stack 300 that would otherwise result from such asymmetric tightening.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A solid state assembly, comprising:
    (a) a stack having a plurality of stack elements; and
    (b) a clamping assembly, said clamping assembly compressing said plurality of stack elements into substantial contact with each other so as to facilitate thermal and electrical communication between at least some of said plurality of stack elements, and said clamping assembly including:
        (i) a clamp frame, said stack being substantially disposed in said clamp frame; and
        (ii) a compression assembly connected to said clamp frame, said compression assembly exerting a compressive force on said stack, and said compression assembly automatically compensating for any horizontal misalignment of said stack so as to facilitate substantially uniform distribution of said compressive force across an upper surface of said stack.

2. The solid state assembly of claim 1, wherein said plurality of stack elements includes at least one semiconductor.

3. The solid state assembly of claim 1, wherein said plurality of stack elements includes at least one heat sink.

4. The solid state assembly of claim 1, wherein said clamp frame comprises upper and lower clamping plates joined together by a plurality of connecting rods.

5. The solid state assembly of claim 1, wherein said stack comprises a high current thyristor.

6. The solid state assembly of claim 1, further comprising at least one alignment pin, said at least one alignment pin passing through an alignment hole defined by said stack and being received in an alignment pin recess defined by said lower clamping plate, and said at least one alignment pin substantially precluding horizontal movement of said stack with respect to said clamp frame.

7. The solid state assembly of claim 1, wherein said compression assembly comprises:
    (a) at least one resilient member arranged in said clamp frame so as to be in at least indirect contact with said stack;
    (b) a compression cap attached to said clamp frame and facilitating deflection of said at least one resilient member so as to cause said at least one resilient member to exert said compressive force;
    (c) a plurality of adjusting elements disposed in operative relation with said compression cap so as to facilitate variations to a magnitude of said compressive force; and
    (d) means for facilitating substantially uniform distribution of said compressive force on said stack.

8. The solid state assembly of claim 7, wherein said means for facilitating substantially uniform distribution of said compressive force on said stack comprises a pivot ball and force distribution member arranged so as to facilitate rotational movement of said force distribution member with respect to said pivot ball, said pivot ball being in a least indirect contact with said at least one resilient member so as to transmit said compressive force to said force distribution member, and said force distribution member transmitting said compressive force to said stack and rotating as required to compensate for any horizontal misalignment of said stack so as to facilitate substantially uniform distribution of said compressive force across said upper surface of said stack.

9. In a solid state assembly including a stack having an upper surface and including a plurality of stack elements, a clamping assembly for compressing said plurality of stack elements into substantial contact with each other so as to facilitate thermal and electrical communication between at least some of said plurality of stack elements, the clamping assembly comprising:
    (a) a clamp frame, said clamp frame including:
        (i) upper and lower clamping plates, said upper clamping plate defining a recess, and the stack being substantially interposed between said upper and lower clamping plates; and
        (ii) a plurality of connecting rods joining said upper and lower clamping plates together; and
    (b) a compression assembly connected to said clamp frame, said compression assembly exerting a compressive force on the stack, and said compression assembly automatically compensating for any horizontal misalignment of the stack so as to facilitate substantially uniform distribution of said compressive force across the upper surface of the stack.

10. The clamping assembly of claim 9, wherein said upper and lower clamping plates substantially comprise aluminum.

11. The clamping assembly of claim 9, wherein said upper and lower clamping plates are joined together so that relative motion between said upper and lower clamping plates is substantially precluded.

12. The clamping assembly of claim 9, wherein said plurality of connecting rods substantially comprise a dielectric material.

13. The clamping assembly of claim 12, wherein said dielectric material substantially comprises a glass epoxy laminate.

14. The clamping assembly of claim 9, wherein said compression assembly comprises:
    (a) at least one resilient member arranged in said clamp frame so as to be in at least indirect contact with the stack;

(b) a compression cap attached to said clamp frame and positioned so as to facilitate deflection of said at least one resilient member and cause said at least one resilient member to exert said compressive force;

(c) at least one adjusting element disposed in operative relation with said compression cap so as to facilitate variations to a magnitude of said compressive force;

(d) a pivot ball positioned to receive said compressive force exerted by said at least one resilient member; and (e) a force distribution member arranged for rotational motion with respect to said pivot ball, said force distribution member transmitting said compressive force to the stack, and said force distribution member rotating about said pivot ball as required to compensate for any horizontal misalignment of the stack so as to facilitate substantially uniform distribution of said compressive force across the upper surface of the stack.

15. The clamping assembly of claim 14, wherein said force distribution member is substantially conical in shape, said pivot ball being at least partially disposed in a socket defined by said force distribution member, and said force distribution member including a compression surface in substantial contact with the upper surface of the stack.

16. The clamping assembly of claim 14, wherein said at least one adjusting element comprises at least one cap screw in threaded engagement with said compression cap so that rotation of said at least one adjusting element imposes a change on said magnitude of said compressive force exerted by said at least one resilient element.

17. The clamping assembly of claim 14, wherein said at least one resilient element comprises at least one spring washer, said at least one spring washer defining a recess wherein said pivot ball is at least partially seated.

18. The clamping assembly of claim 17, wherein said compression cap defines a measuring hole in communication with said recess so as to facilitate at least indirect measurement of a distance over which said at least one spring washer is deflected by said compression cap.

19. In a solid state assembly including a stack having an upper surface and comprising one or more stack elements, a clamping assembly for compressing the stack, the clamping assembly comprising:

(a) a clamp frame, said clamp frame including:
  (i) upper and lower clamping plates, said upper clamping plate defining a recess, and the stack being substantially interposed between said upper and lower clamping plates; and
  (ii) a plurality of connecting rods joining said upper and lower clamping plates together; and (b) a compression assembly disposed in operative relation with said clamp frame, said compression assembly comprising:
  (i) a compression cap having a plurality of adjusting elements;
  (ii) at least one resilient element at least partially received within said recess defined by said upper clamping plate and arranged for contact with said compression cap;
  (iii) a force distribution member arranged for contact with the upper surface of the stack; and
  (iv) a pivot ball interposed between, and arranged for contact with, said at least one resilient member and said force distribution member.

20. The clamping assembly as recited in claim 19, wherein said at least one resilient element comprises at least one spring washer.

21. The clamping assembly as recited in claim 19, wherein said force distribution member defines a portion of a spherical recess configured to at least partially receive the pivot ball.

22. The clamping assembly as recited in claim 19, wherein said compression cap is attached to the upper clamping frame.

23. The clamping assembly as recited in claim 19, wherein said plurality of connecting rods comprises four connecting rods.

24. The clamping assembly as recited in claim 19, further comprising an indicator operatively disposed in connection with the at least one resilient element and configured to facilitate determination of a magnitude of a force exerted on the stack by the clamping assembly.

25. The clamping assembly as recited in claim 19, further comprising an alignment rod passing through at least a portion of the stack and at least partway into the force distribution member.

* * * * *

UNITED STATES PATENT AND TRADEMARK OFFICE
CERTIFICATE OF CORRECTION

PATENT NO. : 6,677,673 B1
DATED : January 13, 2004
INVENTOR(S) : Roger N. Hitchcock It is certified that error appears in the above-identified patent and that said Letters Patent is hereby corrected as shown below:

Column 1,
Line 52, before "useful" insert -- them --

Column 5,
Line 60, change "transfers" to -- transfer --

Column 14,
Line 21, before "least" change "a" to -- at --

Signed and Sealed this

Twenty-seventh Day of July, 2004

JON W. DUDAS
*Acting Director of the United States Patent and Trademark Office*